(12) United States Patent
Nam

(10) Patent No.: US 7,424,406 B2
(45) Date of Patent: Sep. 9, 2008

(54) FILTER CHARACTERISTIC MEASURING METHOD AND SYSTEM

(75) Inventor: Young-Dong Nam, Sungnam (KR)

(73) Assignee: Samsung Electronics Co., Ltd. (KR)

( * ) Notice: Subject to any disclaimer, the term of this patent is extended or adjusted under 35 U.S.C. 154(b) by 355 days.

(21) Appl. No.: 10/737,149

(22) Filed: Dec. 15, 2003

(65) Prior Publication Data

US 2004/0143422 A1     Jul. 22, 2004

(30) Foreign Application Priority Data

Dec. 16, 2002    (KR) ...................... 10-2002-0080116

(51) Int. Cl.
    *G06F 15/00*     (2006.01)
    *H03F 1/26*     (2006.01)

(52) U.S. Cl. ...................... 702/190; 324/158.1; 381/58; 455/67.11; 702/124

(58) Field of Classification Search ................. 702/70, 702/71, 74, 75, 76, 77, 124, 190, 193, 112; 455/127, 63.1; 342/165, 368; 324/158.1; 341/144; 714/740; 381/58

See application file for complete search history.

(56) References Cited

U.S. PATENT DOCUMENTS

| | | | | |
|---|---|---|---|---|
| 4,306,113 A * | 12/1981 | Morton | ......................... | 381/58 |
| 5,208,596 A * | 5/1993 | Dieterich | ..................... | 341/144 |
| 5,357,257 A * | 10/1994 | Nevin | ......................... | 342/165 |
| 5,903,857 A * | 5/1999 | Behrens et al. | ............. | 702/190 |
| 5,929,628 A * | 7/1999 | Becker et al. | ............. | 324/158.1 |
| 6,377,786 B2 * | 4/2002 | Mollenkopf et al. | ...... | 455/127.2 |
| 6,405,147 B1 * | 6/2002 | Fera | ............................ | 702/112 |
| 6,628,923 B1 * | 9/2003 | Eriksson | ..................... | 455/63.1 |
| 6,631,341 B2 * | 10/2003 | Kameda et al. | ............. | 702/124 |
| 6,687,868 B1 * | 2/2004 | Furukawa et al. | ............ | 714/740 |
| 2004/0108953 A1 * | 6/2004 | Chevalier et al. | ............ | 342/368 |

\* cited by examiner

*Primary Examiner*—John H Le
(74) *Attorney, Agent, or Firm*—Mills & Onello LLP

(57) ABSTRACT

Described are a filter characteristic measuring method and system capable of measuring a gain of an analog filter adapted in a DUT (Device Under Test) and a frequency response at a high speed, wherein the filter characteristic measuring method includes the steps of generating an impulse signal; applying the impulse signal to the DUT having an analog filter through a digital channel; and measuring a gain of the analog filter in the DUT and a frequency characteristic by using an output of the analog filter.

1 Claim, 4 Drawing Sheets

FILTER CHARACTERISTIC MEASURING METHOD AND SYSTEM

FIELD OF THE INVENTION

The present invention relates to a test field of measuring a characteristic of a filter employed in a DUT (Device Under Test). More specifically, the invention relates to a filter characteristic measuring method and system for measuring gain of an analog filter and frequency response at high speed.

DESCRIPTION OF THE RELATED ART

A DUT, e.g., a signal conversion system, internally employs an analog filter such as an equalizing filter. Such a DUT is tested through a typical automatic test device in a test procedure or for a product test. Presently, filter characteristics, e.g., boosting gain and frequency response, are measured according to variously required necessities.

FIG. 1 is a block diagram of a conventional simple automatic test device.

Referring to FIG. 1, the conventional automatic test device includes a sine wave oscillator 1, an analog filter 2 and an alternate current (AC) voltmeter 3. The sine wave oscillator 1 generates a sine wave that oscillates as a variably determined frequency in a determined frequency band. The sine wave is applied to the analog filter 2 of the DUT and a line LI1. A switch SW connects one of an output line LI2 of the analog filter 2 and the line LI1 to an input terminal of the AC voltmeter 3. The AC voltmeter 3 selectively receives one of the outputs from the analog filter 2 and the sine wave oscillator 1 to be tested. The AC voltmeter 3 measures an output voltage of the analog filter 2 when the switch SW is connected to the output line LI2, or directly measures an output voltage of the sine wave oscillator 1 when the switch SW is connected to the line LI1. In such a frequency sweep method, gain of the analog filter for a sine wave per each objective frequency is obtained through the AC voltmeter 3, that is, the filter characteristic is measured.

However, such a conventional testing method must be passed through the frequency sweep in order to generate sine waves having respectively different frequencies in a determined frequency band, and an output amplitude must be also measured through the AC voltmeter. Thus, measuring time is lengthened, and further in actual mass-production, such a measurement can be performed only for several frequencies in a frequency band of interest, that is, it is difficult to completely and exactly measure characteristics of an equalizing filter.

SUMMARY OF THE INVENTION

Accordingly, it is an object of the present invention to provide a filter characteristic measuring method and system in which a gain of an analog filter employed in a DUT (Device Under Test) and a frequency response are measured at a high speed, time taken in measuring the gain of the analog filter and the frequency response is remarkably shortened, and output response is measured at a high speed by applying an impulse signal to the DUT including an equalizing filter.

In order to achieve the above objects, according to one aspect of the present invention, a filter characteristic measuring method comprises the steps of generating an impulse signal; applying the impulse signal to a DUT having an analog filter through a digital channel; and measuring a gain of the analog filter in the DUT and a frequency characteristic by using an output of the analog filter.

In accordance with another aspect of the present invention, a filter characteristic measuring system in a DUT employing an analog filter comprises a digital channel for providing an impulse signal without applying a sine wave to the analog filter; a digitizer for receiving an output signal of the analog filter so as to measure a characteristic of the filter; and a controller for controlling the digital channel and the digitizer.

As a result, a gain of an analog filter employed in a DUT and frequency response can be measured at high speed.

BRIEF DESCRIPTION OF THE DRAWINGS

The foregoing and other objects, features and advantages of the invention will be apparent from the more particular description of a preferred embodiment of the invention, as illustrated in the accompanying drawings in which like reference characters refer to the same parts throughout the different views. The drawings are not necessarily to scale, emphasis instead being placed upon illustrating the principles of the invention.

DETAILED DESCRIPTION OF PREFERRED EMBODIMENTS

Figure 2:
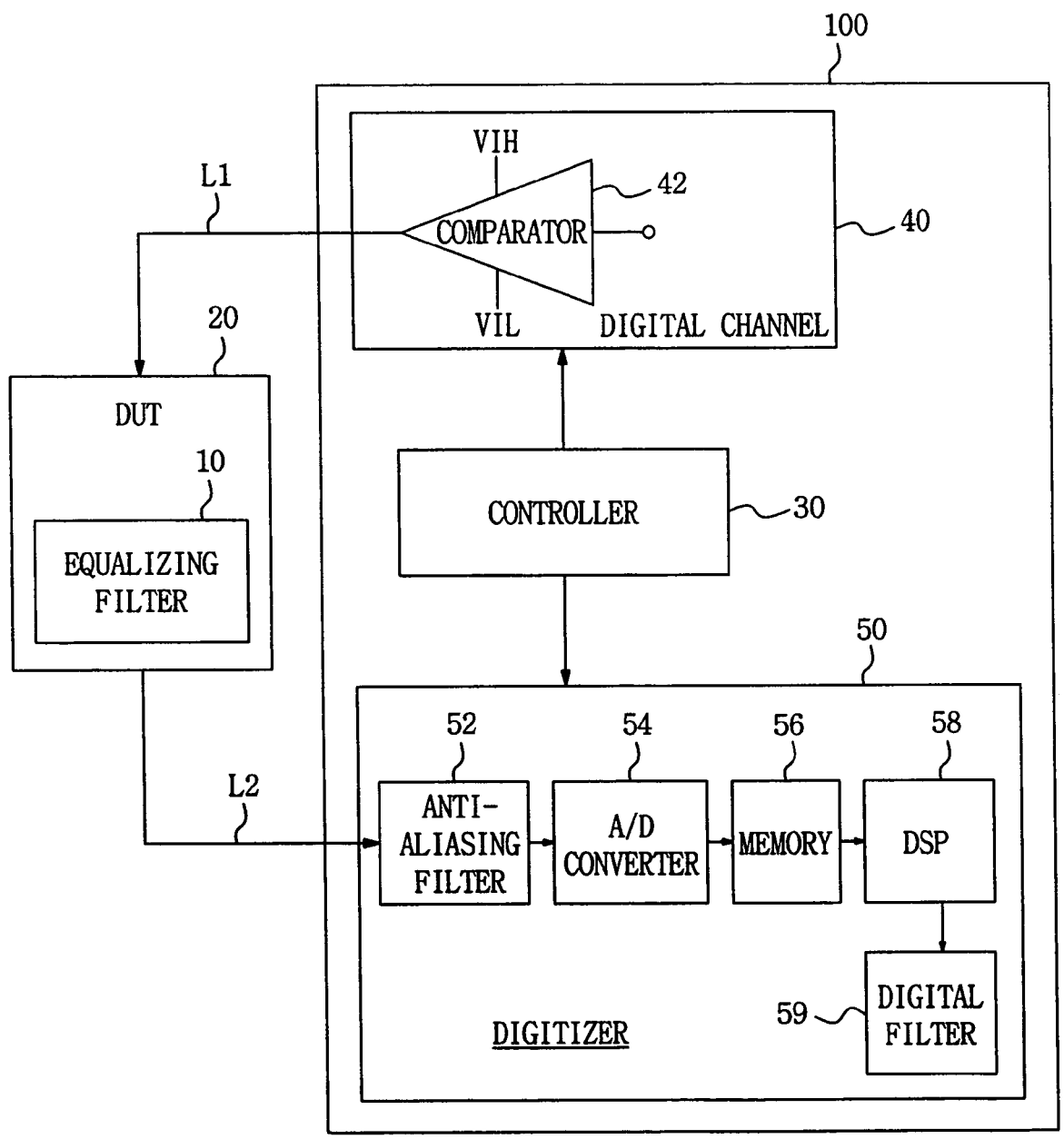
FIG. 2 is a block diagram of a filter characteristic measuring system according to an exemplary embodiment of the present invention.

FIG. 2 is a block diagram of a filter characteristic measuring system according to an exemplary embodiment of the present invention.

FIG. 2 illustrates a DUT (Device Under Test) 20 and a filter characteristic measuring device 100. An impulse signal provided from the filter characteristic measuring device 100 is applied to an input line L1 of the DUT 20 in which an equalizing filter 10 is built. The filter characteristic measuring device 100 is largely divided into a digital channel 40, a controller 30 and a digitizer 50.

Figure 1:
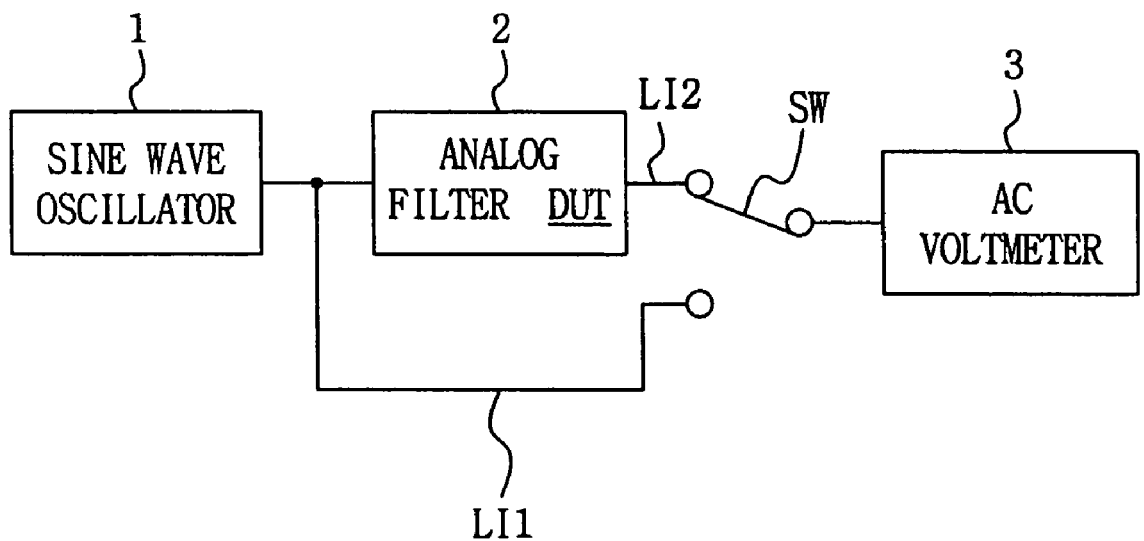
FIG. 1 is a block diagram of a general test system to measure a characteristic of an analog filter.
Figure 3:
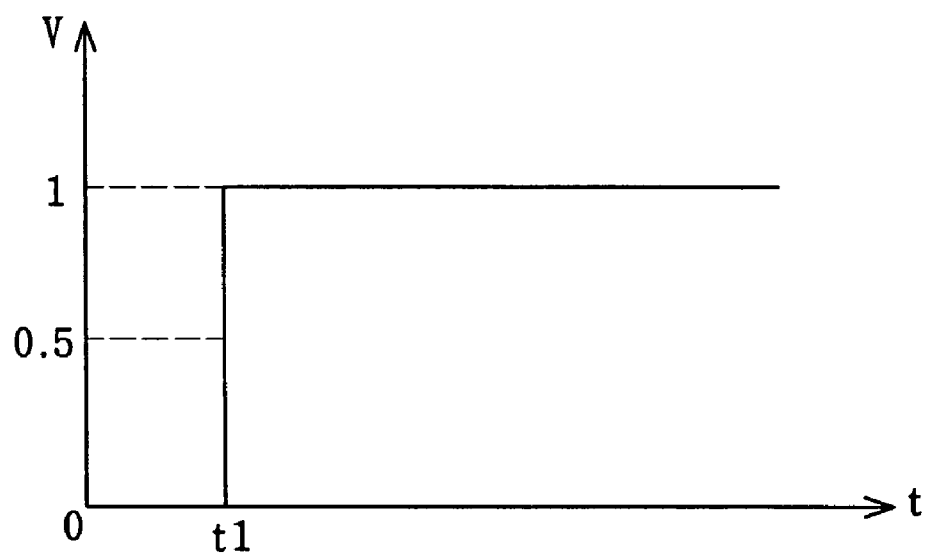
FIGS. 3 to 6 show waveform drawings of signals related to FIG. 2.

The digital channel 40 includes a comparator 42 for generating an impulse signal as shown in FIG. 3.

The digitizer 50 includes an anti-aliasing filter 52 for anti-aliasing-filtering a filter output received through an output line L2 of the DUT 20; an analog to digital(A/D) converter 54 for converting the filter output from the anti-aliasing filter 52 into digital data; a memory 56 for capturing the digital data outputted from the A/D converter 54 at a determined storage region; a digital signal processor (DSP) 58 for processing the digital data captured at the memory 56 by a command of the controller 30; and a digital filter 59 for receiving the processed signal outputted from the DSP 58 and digitally filtering the processed signal.

The filter characteristic measuring device 100 to measure a frequency response characteristic of the equalizing filter 10 applies an impulse signal to the DUT 20 as a specific object by using a digital channel, and analyzes an output waveform outputted from the equalizing filter 10, through the digitizer 50.

Synchronization between an output of the impulse signal and an input of an output signal outputted from the filter is performed by the controller 30. The controller 30 can be embodied by a microprocessor having a test program. An operation of an output response of the filter as the tested object can be performed by the DSP 58 according to a command of the controller 30. The DSP 58 moves the output data stored in the memory 56 to an internal operational-use buffer, and then performs differential and fast Fourier transform (FFT) operations by using a digital signal process algorithm. An output of the DSP 58 is applied to the digital filter 59 and is filtered digitally, to thus eliminate a high frequency component contained in the output of the DSP 58.

FIGS. 3 through 6 represent waveform drawings of the signals related to FIG. 2, where FIG. 3 illustrates a waveform of an impulse signal outputted from the comparator 42.

In FIG. 3, a transverse axis indicates time and a perpendicular axis indicates voltage V. The impulse signal has a theoretically unlimited height and a width of '0', thus can be represented as a function of an area '1'. When this function is represented as a frequency domain through the FFT, all frequency components have a unit size of '1'. Therefore, applying the impulse signal to some device has the same meaning as simultaneously applying sine waves of all frequencies to the device. In the case in which the impulse signal is applied through a digital channel, precision is required so that a signal applied to the DUT is approximate to an ideal impulse signal. In order that the impulse signal is approximate to the ideal signal, rise time of the impulse signal must be very quick as compared to a response time of the DUT. In the case in which the signal approximate to the ideal impulse signal is applied, power is uniformly provided to all frequency components within a measurement frequency band of the DUT as the tested object. Meanwhile, in the case in which an amplitude (height) of the impulse signal is too small, power supplied to a tested object is too weak, and thus output does not perform well, thus the measurement is difficult. Therefore, to obtain a measurable output signal of sufficient amplitude, an impulse signal having sufficient amplitude must be applied to the DUT.

Figure 4:
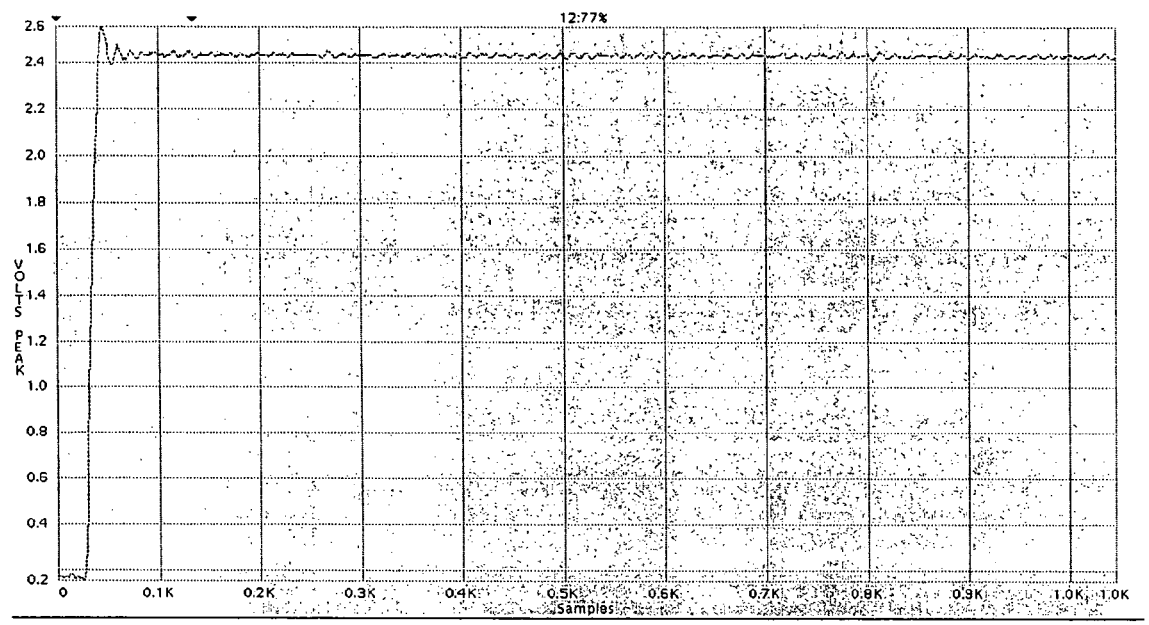

FIG. 4 illustrates an output waveform of the equalizing filter 10 obtained through the anti-aliasing filter 52 of the digitizer 50.

Referring to FIG. 4, a transverse axis indicates frequency and the perpendicular axis represents voltage. An impulse signal like that shown in FIG. 3 is provided to the equalizing filter 10, then an output from the equalizing filter 10 is provided as a real waveform, to thus obtain the output waveform shown in FIG. 4.

Figure 5:
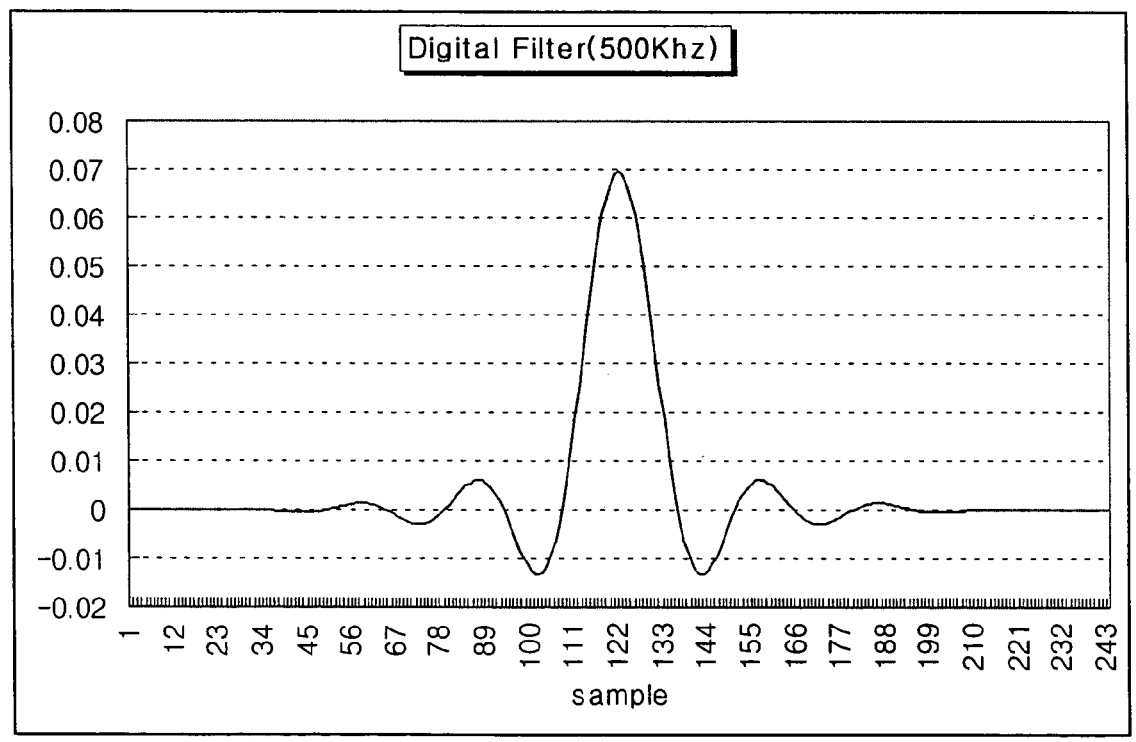

FIG. 5 depicts a filtering characteristic of a digital filter, as an example of a digital filter of about 500 kHz.

Figure 6:
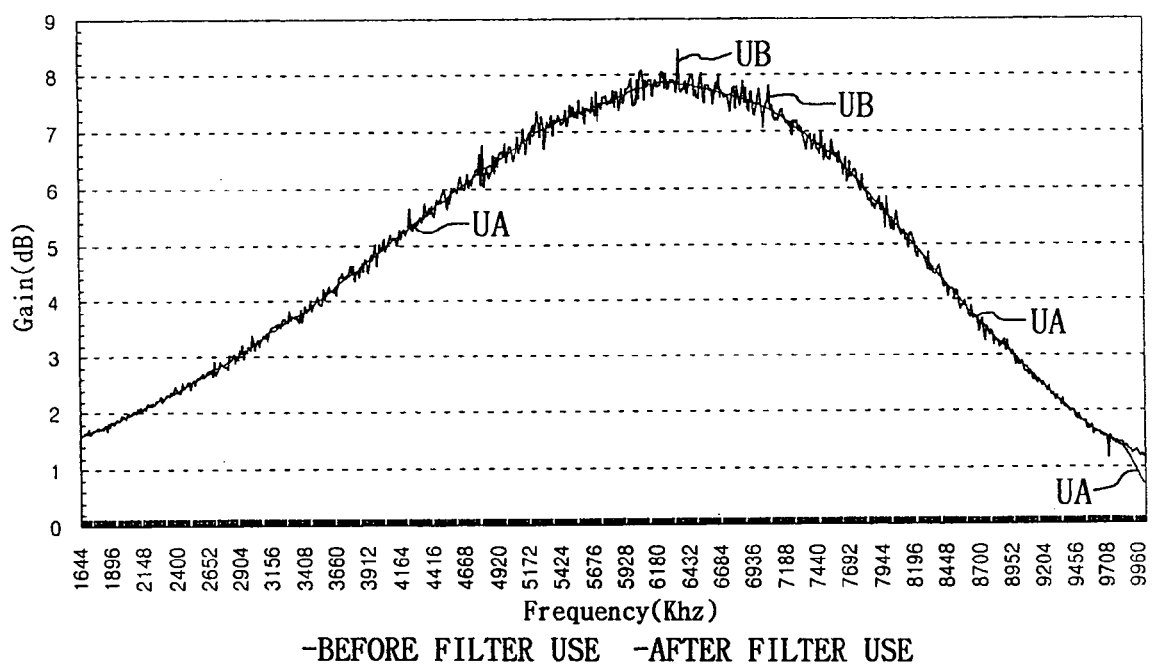

FIG. 6 sets forth waveforms respectively provided in input and output terminals of the digital filter of FIG. 5.

In FIG. 6, an input signal UB before use of the digital filter 59 is obtained by converting an output waveform of FIG. 4 into digital data, then differentiating the digital data to gain an impulse response, and then performing a conversion into an output power spectrum through the FFT operation. Further, an output signal UA after use of the digital filter is obtained by removing a high frequency component through the digital filter. An output signal filtered through the digital filter can readily be used in a measurement for maximum frequency response and gain.

According to an observation made during testing of a system in accordance with the invention, when a characteristic of an equalizing filter 'S5L1462B' adapted as a measuring-use device was measured by a conventional measuring method, it took about 0.5 second. However, when the characteristic was measured by using an impulse signal based on the present invention, it took about 0.05 second. As a result, in the measuring method based on the embodiment of the present invention for measuring the filter characteristic by applying an impulse signal to the filter, the frequency characteristic over the whole region of a frequency band of interest can be measured in a short amount of time. Thus test time is reduced substantially. That is, in the present invention, test time can be shortened over 10 times as compared to the conventional frequency sweep method as a general analog filter testing method.

As described above, the filter characteristic measuring method of the present invention has an effect of measuring a gain of an analog filter and a frequency response at a high speed.

While this invention has been particularly shown and described with reference to preferred embodiments thereof, it will be understood by those skilled in the art that various changes in form and details may be made herein without departing from the spirit and scope of the invention as defined by the appended claims.

What is claimed is:

1. A system for measuring a characteristic of a filter in a DUT employing an analog filter, said system comprising:
   a digital channel for providing an impulse signal without applying a sine wave to the analog filter of the DUT;
   a digitizer for receiving an output signal of the analog filter in response to the impulse signal so as to measure the characteristic of the filter; and
   a controller for controlling the digital channel and the digitizer,
   wherein the digitizer comprises:
   an anti-aliasing filter for antialiasing-filtering an output of the analog filter;
   an analog to digital (A/D) converter for converting a filter output outputted from the anti-aliasing filter into digital data;
   a memory for capturing the digital data outputted from the A/D converter at a determined storage region;
   a digital signal processor (DSP) for processing in signal the digital data captured at the memory; and
   a digital filter for receiving a process signal outputted from the DSP and digitally filtering the process signal.

* * * * *